United States Patent [19]

Fischer et al.

[11] 4,129,688

[45] Dec. 12, 1978

[54] BATTERY COMPARTMENT IN PORTABLE APPARATUS

[75] Inventors: Karl Fischer; Walter Matetschlager, both of Vienna, Austria

[73] Assignee: U.S. Philips Corporation, New York, N.Y.

[21] Appl. No.: 877,381

[22] Filed: Feb. 13, 1978

[30] Foreign Application Priority Data

Feb. 18, 1977 [AT] Austria ............................... 1124/77

[51] Int. Cl.² ............................................. H01M 2/20
[52] U.S. Cl. ..................................... 429/97; 429/123; 339/152
[58] Field of Search ..................... 429/96, 97, 98, 99, 429/100, 123, 121, 1, 9, 122; 339/152, 153, 119 R; 174/52 R

[56] References Cited

U.S. PATENT DOCUMENTS

| 3,881,961 | 5/1975 | Nation | 429/100 X |
| 3,943,537 | 3/1976 | Lange | 429/98 X |
| 4,072,800 | 2/1978 | Gammer | 429/97 |

*Primary Examiner*—Anthony Skapars
*Attorney, Agent, or Firm*—David R. Treacy

[57] ABSTRACT

A portable electronic apparatus having a battery compartment for accommodating a battery, whose contacts can be connected to complementary contacts on a contact carrier. The carrier is mounted to the apparatus, and can be moved within the battery compartment against the action of an elastic element perpendicularly to a side wall of the compartment, and can be pivoted out of the battery compartment together with the battery connected to the complementary contacts.

6 Claims, 2 Drawing Figures

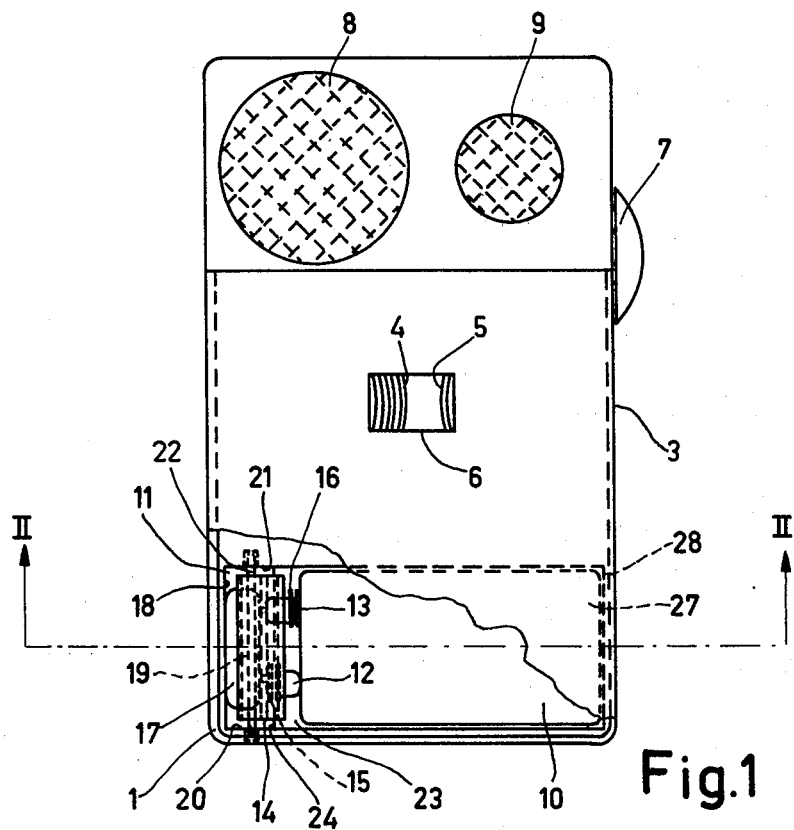
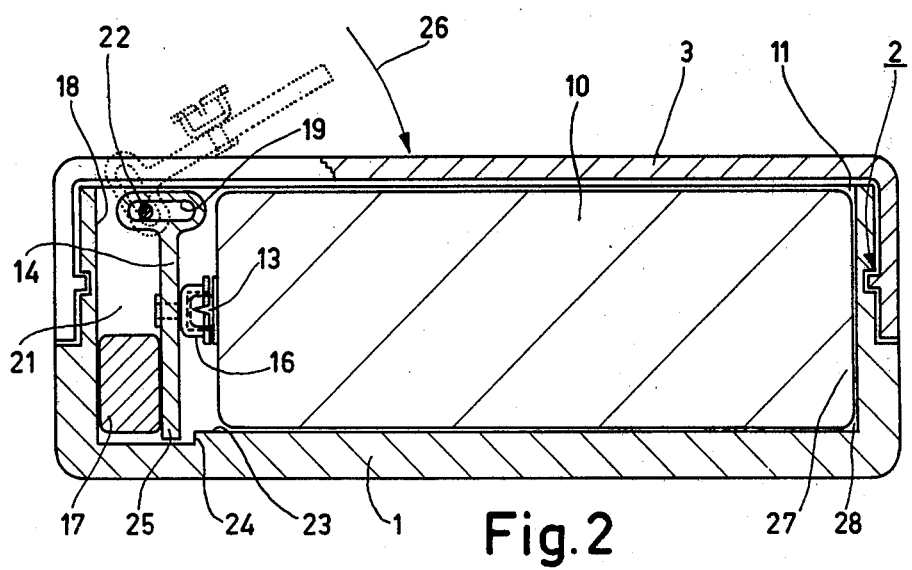

BATTERY COMPARTMENT IN PORTABLE APPARATUS

BACKGROUND OF THE INVENTION

1. Field of the Invention

The invention relates to a battery holder and contact for portable apparatus, such as a magnetic-tape recording and/or playback apparatus, a radio receiver or the like; and more particularly to a battery compartment for accommodating a battery, which has at least one of its contacts connected to a complementary contact on a contact carrier, the contact carrier being connected to the battery before they are introduced into the battery compartment.

2. Description of the Prior Art

In a known commercially available apparatus of this type, the contact carrier together with the battery is placed loosely in the battery compartment. As a result, in the event of vibration or impact loading of the apparatus the contact carrier which is connected to the battery can move undesirably in the battery compartment, and produce annoying noises and mechanical stresses. Furthermore, the loosely disposed contact carrier is connected to the apparatus only by the electrical wires which are connected to the complementary contacts. Because there is no positive mechanical connection, it is common that, in particular when a battery is replaced, these connecting wires are subjected to excessive mechanical stress, and are damaged or broken.

SUMMARY OF THE INVENTION

An object of the invention is to provide a portable electronic apparatus which has a battery compartment and contact carrier which are mechanically rugged and resistant to wire damage when changing batteries.

A further object is to provide an apparatus in which the contact carrier, and battery if in place, are held firmly with respect to the apparatus case.

According to the invention the contact carrier of a portable apparatus is movable in a battery compartment perpendicularly to a side wall of this compartment against the action of at least one elastic element, and is mounted so as to be pivotable out of the battery compartment with the complementary contact on said carrier. Thus, it is ensured that under the influence of the elastic element, which may for example be constituted by a pressure spring or a rubber or foam-plastic buffer, the contact carrier together with the battery is always kept in the operating position, in which an end of the battery remote from the contact carrier bears against the corresponding far sidewall of the battery compartment. To establish a connection between the battery contacts and the complementary contacts on the contact carrier, the carrier with the complementary contacts is simply pivoted out of the battery compartment. The connecting wires which are connected to the complementary contacts are subjected to almost no mechanical load, so that damage to the connecting wires is prevented.

In a preferred embodiment in accordance with the invention the contact carrier has a slotted guide through which a spindle is passed which extends transversely in the battery compartment parallel to the side wall, thus mounting the carrier for both translation and pivoting motion.

In accordance with another preferred embodiment of the invention the battery compartment has a fixed stop on its bottom wall for limiting the movement of the contact carrier under the influence of the elastic element, when the contact carrier is pivoted into the battery compartment in the absence of a battery. This ensures that the contact carrier occupies a stable position when the apparatus is being carried without a battery.

The invention is described hereinafter with reference to an embodiment which is shown in the drawing, but to which the invention is not limited.

BRIEF DESCRIPTION OF THE DRAWING

FIG. 1 is a plan view of a hand-held, battery-operated dictation apparatus in accordance with the invention.

FIG. 2 is a cross-section on an enlarged scale of the battery compartment of the apparatus taken on the line II-II in FIG. 1.

DESCRIPTION OF THE PREFERRED EMBODIMENT

The dictation apparatus, which is schematically shown in FIG. 1, has a box-shaped housing 1, whose opening can be closed with a sliding cover 3 guided by a groove-and-tongue joint 2. When the sliding cover 3 is open the apparatus accepts a cassette which contains a magnetic tape, whose reels of tape 4, 5 can be observed through a window 6 in the sliding cover 3. For controlling the drive means for the magnetic tape the apparatus is provided with a switching button 7, which is movably arranged along a narrow side of the housing; in a manner, not shown, by means of the same switch the electrical devices such as amplifiers and the like may be also switched on. For recording or playing back dictations which are to be or have been recorded on the magnetic tape, the apparatus includes a built-in microphone and a built-in loudspeaker, which are disposed behind net-like covers 8 and 9 of the housing.

The power supply of the apparatus is provided by an electric battery 10, which is accommodated in a battery compartment 11 of the apparatus. The battery 10 is provided with two contacts 12 and 13, which in the usual manner take the form of a pin and socket which can be connected to complementary contacts 15 and 16 mounted on a flat plate contact carrier 14. The contact carrier 14 together with the battery 10 can be placed into the battery compartment 11.

The contact carrier 14 is movable in the battery compartment 11 against the action of an elastic element or buffer 17, in simple translation perpendicular to a side wall 18 of the battery compartment 11 and in pivotal motion out of the battery compartment 11, the complementary contacts 15 and 16 moving with it. The elastic element 17 is preferably made of rubber or a foam plastic, which is secured to the side wall 18.

To render it movable in both translation and pivoting the contact carrier 14 has a slotted guide 19 through which a spindle 22 is passed, the spindle extending transversely in the battery compartment 11 parallel to the side wall 18 adjacent the opening of the battery compartment and housing, and mounted in its side walls 20 and 21. As can be seen in FIG. 2, the guide 19 is disposed on the contact carrier 14 in such a way that, when the contact carrier and battery together have been pivoted into the battery compartment 11, the longitudinal direction of the slotted guide opening 19 extends perpendicularly to the side wall 18 of the battery compartment 11, so that the contact carrier can translate in this direction.

In the bottom wall 23 of the battery compartment 11 a raised portion or stop 24 is formed, against which the free, bottom end 25 of the contact carrier 14 bears under the influence of the elastic element 17, when the contact carrier 14 has been pivoted into the battery compartment without the battery, so that the contact carrier also has a stable position in the absence of a battery.

Dotted lines in FIG. 2 show the contact carrier 14, with the complementary contacts mounted on it, pivoted out of the battery compartment 11. When a battery 10 is to be fitted its contacts 12, 13 are connected to the complementary contacts 15, 16 on the contact carrier 14, which was previously pivoted out of the battery compartment 11 and is retained by hand, after which by a pivotable movement in the direction of the arrow 26 the contact carrier 14 together with the battery 10 connected to it is placed in the battery compartment 11, the contact carrier 14 being positioned against the elastic buffer 17 and compressing the buffer until the bottom end 25 of the carrier clears the stop, the upper end having the slot 19 being moved manually toward the side wall 18. When the battery 10 has been fully inserted into the battery compartment 11 and manually released, the biasing force of the elastic buffer 17 against the contact carrier 14 causes the end 27 of the battery remote from the contact carrier 14 to bear against the far side wall 28 of the battery compartment. For removal of the battery 10 from the battery compartment 11 the battery together with the contact carrier 14 is first manually moved in the direction of the sidewall 18 of the battery compartment 11 against the action of the elastic element 17, so that the bottom 25 of the carrier will clear the stop 24, and is subsequently pivoted out of the battery compartment, after which the battery 10 can easily be separated from the contact carrier 14.

Similar movements of the carrier 14 alone are made when the apparatus is to be closed without a battery, and reopened for insertion of a battery.

Thus, the battery 10 is always firmly retained in the battery compartment 11 and can make no undesired movements in the event that the apparatus is subjected to vibration or impact loads. Further, when carrying the apparatus without any battery, the contact carrier is held against the stop 24 and damage to the carrier or its connection wires by bouncing loosely around the compartment is prevented.

The contact carrier 14 is mechanically positively connected to the apparatus by the spindle 22, so that when a battery is inserted or replaced the connecting wires (not shown for simplicity), which run from the complementary contacts on the contact carrier to the switch or other electrical parts, are not subjected to any mechanical stress.

Obviously, a series of modifications to the embodiment shown are possible, in particular in respect of the mounting of the contact carrier. For example, instead of a slotted guide which extends over the full width of the contact carrier, it is of course also possible to use two such guides of smaller width. Alternatively, the contact carrier may be mounted by journal pins extending coaxially from the carrier and projecting into correspondingly disposed guide slots in the side walls 20, 21 of the battery compartment.

We claim:

1. A portable electronic apparatus having a battery compartment for accommodating a battery having contacts for making electrical connection, and a contact carrier having a complementary contact for electrical connection to one of said battery contacts, said battery compartment having a side wall, and further comprising:

means for mounting said carrier for pivotal motion out of the battery compartment, and for translation in a direction perpendicular to said side wall, and
means for resiliently biasing said carrier in a direction opposite said direction.

2. An apparatus as claimed in claim 1 wherein said means for mounting includes a pivot element arranged for pivoting of the carrier about an axis parallel to said side wall, and a guide having a slot engaged by said element, said slot extending longitudinally in a direction perpendicular to said side wall at least when said carrier is in a position in which a battery is accommodated in the compartment in an operating position.

3. An apparatus as claimed in claim 2 wherein said compartment has an opening for pivoting movement of said carrier and a battery connected to said carrier out of the compartment, said pivot element is fixed in said compartment adjacent said opening, said slot is formed in said carrier, and said means for biasing is an elastic element.

4. An apparatus as claimed in claim 1 wherein said compartment has a bottom wall having a stop arranged to engage said carrier for limiting movement of said carrier away from said side wall, due to said means for biasing, in the absence of a battery.

5. An apparatus as claimed in claim 4, wherein said stop is fixed in position along said bottom wall, the carrier has a bottom end which engages said stop in the absence of a battery, said means for mounting said carrier is so arranged that, in order to pivot said carrier out of the compartment in the absence of a battery, and end of the carrier opposite said bottom end must be moved toward said side wall against force exerted by said means for biasing.

6. An apparatus as claimed in claim 5, wherein said means for mounting includes a slot disposed adjacent said end of the carrier opposite said bottom end, said slot extending in a direction perpendicular to said side wall at least when said carrier is in a position in which a battery is accommodated in the compartment in an operating position, and a pivot element engaging said slot and arranged for pivoting of the carrier about an axis parallel to said side wall.

* * * * *